US012748135B2

(12) United States Patent
Nikolovski

(10) Patent No.: US 12,748,135 B2
(45) Date of Patent: Sep. 29, 2026

(54) SYSTEM FOR MEASURING AN ELECTRIC CURRENT AND DEVICE FOR DETECTING AN ELECTRIC CURRENT FOR SUCH A SYSTEM

(71) Applicant: Commissariat à l'Energie Atomique et aux Energies Alternatives, Paris (FR)

(72) Inventor: Jean-Pierre Nikolovski, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 212 days.

(21) Appl. No.: 18/638,768

(22) Filed: Apr. 18, 2024

(65) Prior Publication Data

US 2024/0353451 A1 Oct. 24, 2024

(30) Foreign Application Priority Data

Apr. 19, 2023 (FR) ...................................... 2303891

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC ... G01R 15/207; G01R 19/0092; G01R 15/26
See application file for complete search history.

(56) References Cited

U.S. PATENT DOCUMENTS 4,920,522 A * 4/1990 Duerr ................. G01R 29/0892 367/134
5,488,955 A * 2/1996 Dias ......................... A61B 8/12 600/459
6,269,700 B1 8/2001 Nikolovski
(Continued)

FOREIGN PATENT DOCUMENTS

EP 1092980 A1 4/2001
EP 1406094 A1 4/2004
EP 2400308 A1 12/2011

OTHER PUBLICATIONS

French Search Report for application No. FR 2303891, mailed Oct. 20, 2023, 2 pages.
(Continued)

*Primary Examiner* — Feba Pothen
(74) *Attorney, Agent, or Firm* — Jordan IP Law, LLC

(57) ABSTRACT

A system (10) for measuring an electric current (I) flowing through an electrically conductive element (2) comprises a device (15) for generating a magnetic field in the electrically conductive element, comprising a support (53) and an electrically conductive wire (50) rigidly coupled to the support, and comprising at least one coil (52) wound around the support. The system further comprises a device for detecting (60) acoustic waves on the surface of the electrically conductive element, and a control and acquisition device (30) comprising a generator (33) configured to provide at least one current pulse in the electrically conductive wire and an acquisition chain for detecting an electrical signal (S) provided by the detection device.

21 Claims, 9 Drawing Sheets

(56) References Cited

U.S. PATENT DOCUMENTS

| | | | | |
|---|---|---|---|---|
| 2013/0327217 | A1* | 12/2013 | Tatsumi | B65B 3/22 96/175 |
| 2022/0043049 | A1* | 2/2022 | Cheng | G01R 31/2656 |

OTHER PUBLICATIONS

Ishido, Masahiro. "Acoustic-wave-based voltage sensors." Sensors and Actuators A: Physical 44, No. 3 (1994): 183-189.

* cited by examiner

SYSTEM FOR MEASURING AN ELECTRIC CURRENT AND DEVICE FOR DETECTING AN ELECTRIC CURRENT FOR SUCH A SYSTEM

FIELD

The present description relates generally to the measurement of static or time-varying electric current.

BACKGROUND

For some applications, it would be desirable to be able to measure a static or time-varying electric current with a spatial resolution of less than 0.1 mm, in particular to be able to measure the intensity and/or direction of flow of the electric current. The electric current to be measured corresponds, for example, to the electric current flowing through a conductive track on a printed circuit board.

An example of a commercially available device for detecting an electric current is a Hall-effect sensor. However, such a sensor generally has a spatial accuracy higher than 0.1 mm, and is therefore unsuitable for measuring a highly localized electric current. In addition, existing Hall-effect sensors have a limited bandwidth that does not exceed 100 kHz, and are therefore unsuitable for measuring high-frequency electrical current.

SUMMARY

One embodiment overcomes some or all of the drawbacks of known electric current detection devices and system for measuring an electric current comprising such devices.

One object of one embodiment is that the system for measuring the current enables measurement of a constant or time-varying electrical current with a spatial resolution of less than 0.1 mm.

One object of one embodiment is that the electric current detection device of the system for measuring an electric current can be manufactured at reduced cost.

One embodiment provides a system for measuring an electric current flowing through an electrically conductive element, the system comprising:

- a device for generating a magnetic field in the electrically conductive element, comprising a support and an electrically conductive wire rigidly coupled to the support and comprising at least one coil wound around the support;
- a device for detecting acoustic waves on the surface of the electrically conductive element; and
- a control and acquisition device comprising a generator configured to provide at least one current pulse in the electrically conductive wire and an acquisition chain for detecting an electrical signal provided by the detection device.

According to one embodiment, the system further comprises an acoustic waveguide having a base and a tapered end attached to the support, and the detection device is an electroacoustic transducer rigidly coupled to the base.

According to one embodiment, the detection device comprises a contactless vibration sensor.

According to one embodiment, the detection device comprises a laser vibrometer.

According to one embodiment, the support corresponds to a ferromagnetic rod, with the coils wound around the ferromagnetic rod.

According to one embodiment, the device for generating a magnetic field comprises a permanent magnet.

According to one embodiment, the generator is configured to provide the current pulse in the electrically conductive wire having a duration half as short as the period corresponding to the maximum variation frequency of the electric current flowing through the electrically conductive element.

According to one embodiment, the control and acquisition device comprises an amplifier receiving the measurement signal, the gain of which is programmable in increasing steps, each step corresponding to a possible range of variation in the magnitude of the electric current flowing through the electrically conductive element.

One embodiment also provides a device for detecting an electric current flowing through an electrically conductive element comprising:

- a device for generating a magnetic field in the electrically conductive element, comprising a support and an electrically conductive wire rigidly coupled to the support and comprising at least one coil wound around the support;
- an acoustic waveguide having a base and a tapered end attached to the support; and
- an electroacoustic transducer rigidly coupled to the base.

According to one embodiment, the device comprises from one coil to twenty coils, preferably from two coils to six coils.

According to one embodiment, the support corresponds to a ferromagnetic rod, with the coils wound around the ferromagnetic rod, and the ferromagnetic rod enters the acoustic waveguide through the tapered end.

According to one embodiment, the end of the ferromagnetic rod opposite the tapered acoustic waveguide is sharpened.

According to one embodiment, the device comprises a permanent magnet in contact with the ferromagnetic rod housed in the acoustic waveguide.

According to one embodiment, the acoustic waveguide extends along an axis from the base to the tapered end, with the cross-sectional area of the acoustic waveguide decreasing from the base up to the tapered end.

According to one embodiment, the electroacoustic transducer is a transverse-wave electroacoustic transducer.

According to one embodiment, the acoustic waveguide is at least partly truncated cone shaped.

According to one embodiment, the acoustic waveguide has an apex angle of less than 15°.

According to one embodiment, the acoustic waveguide is made of a non-magnetic material.

According to one embodiment, the melting temperature of the acoustic waveguide and the melting temperature of the electrically conductive wire are higher than 1000° C.

According to one embodiment, the acoustic waveguide comprises a disk-shaped portion, having an axis, thinned at said axis, the support extending along said axis and being coupled to said portion at said axis.

According to one embodiment, the electroacoustic transducer comprises at least one piezoelectric half ring resonating in thickness and attached to the edge of said portion.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to a probe as orientated during normal use.

Unless specified otherwise, the expressions "around", "approximately", "substantially" and "in the order of" signify within 10%, and preferably within 5%. In the case of angles, the expressions "about", "approximately", "substantially" and "in the order of" signify within 10°, preferably within 5°. Furthermore, the terms "insulator" and "conductor" are taken here to mean "electrically insulating" and "electrically conductive" respectively.

Figure 1:
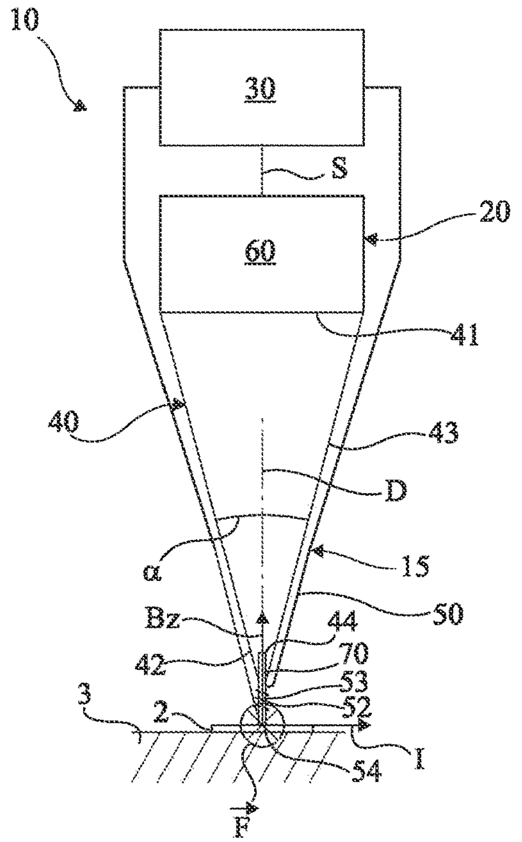
FIG. 1 is a partial schematic cross-sectional view of an embodiment of a system for measuring an electrical current.

FIG. 1 is a schematic partial cross-sectional view of an embodiment of a system 10 for measuring an electric current I. The electric current I to be measured corresponds, for example, to the electric current flowing through a conductive track 2. This is, for example, a conductive track forming part of a printed circuit board 3. The system 10 allows the current intensity I and the direction of current I flow through track 2 to be measured.

System 10 comprises a device 15 for generating a magnetic field, a mechanical wave sensor 60, and a control and acquisition device 30 coupled to the device 15 for generating the magnetic field, and to the mechanical wave sensor 60. The mechanical wave sensor 60 provides a signal S to the control and acquisition device 30. The device 15 for generating the magnetic field comprises an electrically conductive wire 50, which forms coils 52 of axis D wound around a support 53.

According to one embodiment, the device 15 for generating a magnetic field and the mechanical wave sensor 60 are part of a device 20 for detecting a current, hereinafter referred to as a probe, which further comprises a guide 40 coupling the support 53 to the mechanical wave sensor 60. According to one embodiment, the guide 40 is an acoustic waveguide 40 and the mechanical wave sensor 60 is an electroacoustic transducer coupled to the acoustic waveguide 40. The free end of support 53 is hereinafter referred to as the end 54 of probe 20.

In the embodiment shown in FIG. 1, the acoustic waveguide 40 has a tapered shape along the axis D, with a straight cross-section the area of which decreases from a base 41 up to a tapered end 42, opposite the base 41, at the junction with the support 53 of the coils 52. Acoustic waveguide 40 is hereinafter referred to as tapered waveguide 40. In the embodiment illustrated in FIG. 1, the tapered guide 40 comprises a cylindrical opening 44 with axis D at the tapered end 42, which enters the tapered guide 40 over part of the height of the tapered guide 40.

According to one embodiment, the tapered guide 40 has the general shape of a truncated cone, truncated pyramid, or truncated paraboloid. Preferably, the tapered guide 40 is rotationally symmetrical about the axis D. The tapered guide 40 has an apex angle α of less than 15°, preferably less than 10°, more preferably less than 5°. According to one embodiment, the diameter of the base 41 of the tapered guide 40 ranges from 1 mm to 10 mm, and is preferably equal to 5 mm. According to one embodiment, the height of the tapered guide 40, measured along the axis D, ranges from 5 mm to 100 mm, and is preferably equal to about 15 mm.

The device 15 for generating a magnetic field comprises a rod 70 made of ferromagnetic material which is partly housed in the opening 44, and projects outside the tapered guide 40. The ferromagnetic rod 70 is rigidly attached to the tapered guide 40. The part of the rod 70 outside the tapered guide 40 constitutes the support 53 for the coils 52. The conductive wire 50 extends along the sidewall 43 of the tapered guide 40, and is wound onto the rod 70 to constitute the coils 52 around the rod 70. According to one embodiment, ferromagnetic rod 70 is made of ferrite, e.g. wide-band soft ferrite based on NiZn or NiMn alloy, optionally coated with a protective hardening varnish to prevent the ferrite from flaking.

The diameter of the ferromagnetic rod ranges from 0.7 mm to 2 mm. According to one embodiment, the height, measured along the axis D, of the ferromagnetic rod 70 housed in the opening 44 ranges from 0.5 mm to 5 mm, and is preferably equal to 1 mm. According to one embodiment, the height, measured along the axis D, of the ferromagnetic rod 70 located outside the opening 44, i.e. the height of the support 53 of the coils 52, ranges from 0.5 mm to 5 mm, and is preferably equal to 0.5 mm. The ferromagnetic rod 70 acts as a magnetic guide. According to one embodiment, the end 54 of the ferromagnetic rod 40 can be sharpened to provide the magnetic field over an infinitesimal area.

Figure 2:
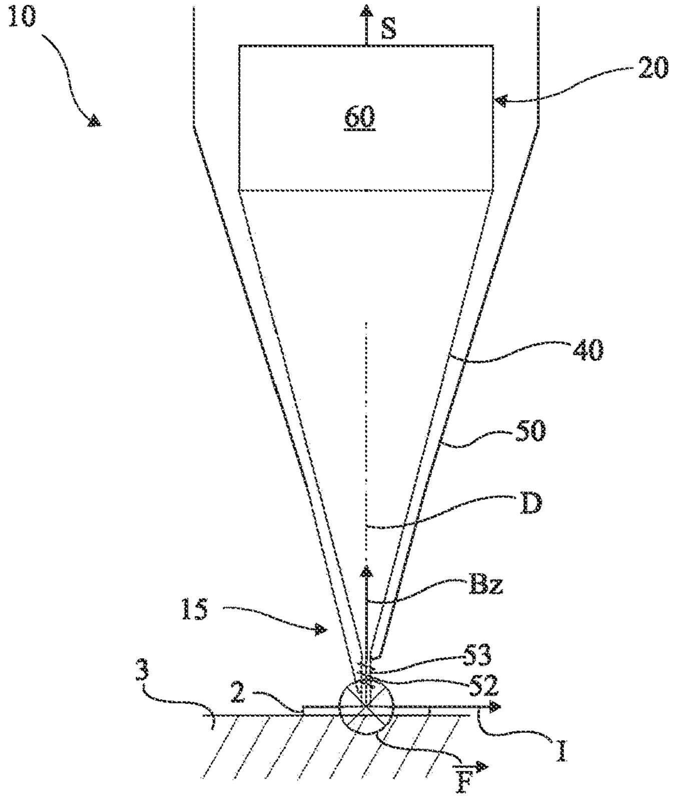
FIG. 2 is a partial schematic cross-sectional view of another embodiment of the probe of the measurement system shown in FIG. 1.

FIG. 2 is a partial schematic cross-sectional view of another embodiment of the probe 20 of the system 10 for measuring an electric current. The probe 20 shown in FIG. 2 comprises all the elements of the probe 20 shown in FIG. 1, with the difference that the ferromagnetic rod 70 is not present, with the support 53 for the coils 52 then corresponding to a cylindrical rod of axis D extending the tapered guide 40. The support 53 and the tapered guide 40 may correspond to a single-piece part or two separate parts attached to each other.

The flow of an electric current through the coils 52 of the conductive wire 50 causes a magnetic field B to be generated. Bz designates the component of the magnetic field B along the axis D. The intensity and range of the magnetic field generated by the coils 52 depends in particular on the number of coils 52, the diameter of the coils 52, and the intensity of the current flowing through the coils 52. The strength of the magnetic field decreases with distance Z from the last coil 52 located near the end 54.

Figure 3:
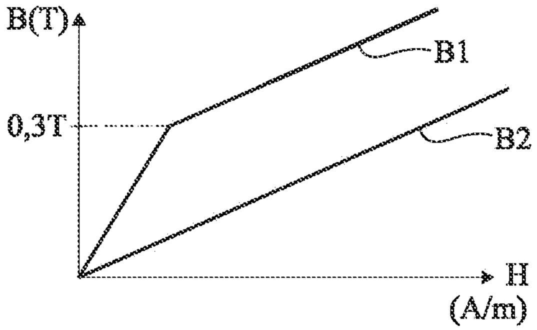
FIG. 3 illustrates curves showing the evolution of the magnetic field produced by the probes of the measurement systems shown in FIGS. 1 and 2.

FIG. 3 illustrates curves showing the evolution of the maximum magnitude B of the magnetic field produced by the probe 20 of the measurement system shown in FIG. 1 (curve B1), and by the probe 20 of the measurement system shown in FIG. 2 (curve B2) as a function of the magnetic excitation H.

In the embodiment shown in FIG. 1, when the diameter of the ferromagnetic rod 70 is less than 1 mm, the magnetic field Bz can locally reach magnetic saturation of the material making up the ferromagnetic rod 70, typically around 0.3 T.

In the embodiment shown in FIG. 2, the diameter of the coils 52 can be very small, typically less than 200 μm, and the component Bz of the magnetic field can reach a peak pulse value greater than 1 T, directly proportional to the intensity of the peak pulse current flowing through the coils 52.

In operation, the end 54 of probe 20 is positioned at the location of the current I to be measured, and is brought into direct physical contact with the printed circuit board 3 at track 2. The axis D of probe 20 is preferably arranged in a position orthogonal to the plane of the printed circuit board 3. A tolerance of +/−10 degrees for a 1% measurement is nevertheless possible on the tilt of the axis D with respect to the direction perpendicular to the plane of the printed circuit board 3 insofar as the signal S provided by electroacoustic transducer 60 evolves as a cosine of this angle.

The control and acquisition device 30 causes a current to flow through the conductive wire 50, resulting in the generation of the magnetic field $\vec{B}$ in track 2 at end 54 of probe 20. When the end 54 is brought into direct contact with the printed circuit board 3, either directly with the conductive track 2, or through an insulating varnish protecting the conductive track 2, the field lines emerging from the end 54 plunge the track 2, through which the current I flows, into the field Bz.

The result is a Lorentz force $\vec{F}$ oriented in the plane of printed circuit board 3, so-called Transverse Horizontal (TH), perpendicular to the plane formed by the direction of the component Bz, and the direction of the current I. The magnitude F of the Lorentz force $\vec{F}$ is defined by the following equation:

$$F = I\Delta t V B_z, \quad \text{[Math 1]}$$

where V is the speed of the electrons in conductive track 2.

To detect a direct electric current I, the magnetic field B should be pulsed, so that the Lorentz force F is pulsed. The sampling of the current I to be measured is thus obtained by applying a transient magnetic field B.

According to one embodiment, the control and acquisition device 30 is configured to provide a current pulse in the conductive wire 50 for a sampling time Δt. This causes the pulsed magnetic field $\vec{B}$ to be formed in track 2 at end 54 of probe 20, with a component Bz along the axis D.

This Lorentz force exists for the duration Δt of the current pulse in the coils 52. The Lorentz force generates an ultrasonic wave, also of the Transverse Horizontal (TH) type, in the printed circuit board 3. The ultrasonic wave couples at the end 54, which is in direct mechanical contact with the printed circuit board 3. The ultrasonic wave travels up the support 53 of the coils 52 in the form of a bending wave, is transmitted to the tapered guide 40, and propagates in the tapered guide 40, also in the form of a bending wave, to the acoustic transducer 60. In particular, the magnitude of the ultrasonic bending wave is proportional to the component Bz of the magnetic field $\vec{B}$ generated in the conductive track 2, to the intensity of the current I flowing through track 2, and to the sampling time Δt. The bending wave is polarized in the direction of the vector product $\vec{I} \wedge \vec{B}$ perpendicular to the plane in FIG. 1 defined by the axis D and the tangent to track 2. Due to its overall tapered shape with a small angle at the apex, the tapered guide 40 promotes the propagation of an acoustic bending mode generated at the end 54 of the probe 20 up to the base 41.

The transmission of the Lorentz force in the form of stress imposed on the end 54 of probe 20 corresponds to a transmission from a medium with a higher mechanical radiation impedance to a medium with a lower mechanical radiation impedance. The end 54 of probe 20 is therefore blocked when in contact with printed circuit board 3, and is subject to the dominant radiation impedance of the surface in contact, in this case that of printed circuit board 3, even if the intrinsic transverse impedance (product of the density of the material and the speed of transverse waves in the material) of the material making up the main component of printed circuit board 3 is lower than that of support 53. Indeed, the radiation impedance is the intrinsic impedance weighted by the volume of material contained in a half-wavelength. This weighting is very advantageous for the printed circuit board 3 in contact with the probe 20, which is very closely surrounded by material (less than half a wavelength), whereas it is weak for the end 54 of the probe 20, which is very sparsely surrounded by material.

In the embodiment shown in FIG. 1, the penetration length of the ferromagnetic rod 70 into the tapered guide 40 is reduced so that the acoustic coupling between the ferromagnetic rod 70 and the tapered guide 40 occurs over a length less than half the wavelength of the bending wave propagating in the tapered guide 40.

The end 42 of the tapered guide 40 at the junction with the ferromagnetic rod 70 defines a very thin circular lip with a radiation impedance less than or equal to that of the ferromagnetic rod 70 inserted therein. The Lorentz force is exerted on a quasi-point surface, and there is no acoustic resonance at the end that could interfere with the waveform, with the difference for a bending resonance of the ferromagnetic rod 70 over its height. To reduce this risk, the height of the part of the ferromagnetic rod 70 that is not inserted in the tapered guide 40, i.e. the height of the support 53 of the coils 52 of the ferromagnetic rod 70, is reduced so as to be less than half the wavelength of the bending wave propagating through it at the center frequency of maximum sensitivity of the acoustic transducer 60.

In the absence of mechanical resonance of the end 54 of the probe 20, the profile of the ultrasonic wave generated by the Lorentz force is then imposed by the bandwidth of the tapered guide 40 and the electroacoustic transducer 60. Furthermore, the base diameter 41 of the tapered guide 40 must remain small and comparable to the wavelength in order to maintain a high bandwidth. The intrinsic impedance of the material making up the tapered guide 40 is equal to the product of the fundamental speed of a transverse wave in the material and the density of the material. The mechanical radiation impedance of the end 54 of the tapered guide 40 is defined as the product of the phase speed of an acoustic wave at the coupling point and the density of the material making up the tapered guide 40. The mechanical radiation impedance is particularly low, typically 3 to 4 times lower than the intrinsic impedance of the material. This characteristic is advantageously suited to efficient transfer of the Lorentz force occurring in the rod 70 rigidly coupled to the tapered guide 40. The acoustic wave reaches the electroacoustic transducer 60, which converts it into an electrical signal S, for example a voltage. The control and acquisition device 30 is configured to measure the electrical signal S provided by the electroacoustic transducer 60, and to deduce from it the intensity I of the current flowing through track 2 and the direction of current I flow through track 2.

Probe 20 can operate in two modes, a so-called passive mode and a so-called active mode. The passive operating mode enables asynchronous observation of the switching currents flowing through the conductive track 2 on which the probe 20 is placed. In this configuration, the sensitivity of probe 20 is not controlled, as the mechanical excitation spectrum of the Lorentz force depends entirely on the spectral band of the current flowing through conductive track 2. Nevertheless, this approach is interesting for observation, i.e. the identification of current signals in a fairly wide frequency band of up to 80% of the central resonance frequency of the electroacoustic transducer 60. The passive operating mode is well suited to the observing of current switching in a spectral band ranging from 100 kHz to 2 MHz. There is no sensitivity to direct current, as a continuous Lorentz force does not propagate in the conical guide, and neither the piezoelectric transducer nor the amplification electronics have any sensitivity to static stress compared with its peak sensitivity at its central resonant frequency, which can be selected from a band typically ranging from 100 kHz to 5 MHz.

The active operating mode exploits the current pulse flowing through the coils to create a more intense, peak-controlled pulsed magnetic field Bz, and to sample with greater sensitivity a current flowing through the conductive track 2 beneath the probe 20 at a predetermined time synchronous with a synchronization signal described in greater detail in the following. In this case, ferromagnetic rod 70 can operate in saturated mode. The current pulse in the coils 52 then preferably has a duration less than or equal to half the resonant center frequency of the electroacoustic transducer 60. In the presence of a direct or alternating current with a frequency less than half the center frequency of the electroacoustic transducer 60, a calibrated pulsed Lorentz force can be produced, the magnitude of which is proportional to the peak magnitude of the current flowing through the conductive track 2. The bandwidth of a calibrated probe 20 thus ranges from direct to half the center frequency of the electroacoustic transducer 60, i.e. typically from 0 Hz to 2 MHz.

According to one embodiment, the intensity of the current pulse in the conductive wire 50 is preferably as high as possible, in practice between 1 A and 100 A peak, preferably approximately between 30 A and 50 A peak. According to one embodiment, the duration $\Delta t$ of the current pulse in the conductive wire 50 is as short as possible, for example between 1 ns and 5 000 ns, preferably about 100 ns. In the case where the electric current to be measured corresponds to a current pulse, the duration $\Delta t$ is less than the duration of the electric current pulse to be measured. If the electric current to be measured corresponds to a sinusoidal electric current, the duration $\Delta t$ is less than at least twice the period of the sinusoidal electric current to be measured. Generally speaking, in the case the electric current to be measured varies over time, the duration $\Delta t$ is less than at least twice the period corresponding to the maximum frequency of variation of the electric current to be measured.

According to one embodiment, the signal associated with a direct current and the signal associated with a transient current can be recorded, and when both types of current exist, the signal representative of the direct component is subtracted from the total signal, the total signal being the sum of the effects of the direct current and the current switching. All that remains is the switching information. The measurement system 10 can then measure a transient electric current.

Advantageously, the lateral footprint of the end 54 of the probe 20 is at least ten times smaller than the lateral footprint of Hall effect probes currently commercially available.

The tapered guide 40 advantageously introduces an acoustic propagation delay of 1 us to 100 us between the magnetic field pulse generated at the end 54 of the probe 20 and the provision of the electrical signal by the electroacoustic transducer 60. This avoids interference to the receive amplifier of the control and detection device 30 by direct air coupling between the magnetic field pulse and the receive electronics.

According to one embodiment, conductive wire 50 has a cylindrical straight cross-section. According to one alternative embodiment, conductive wire 50 has a non-cylindrical straight cross-section. In this case, the diameter of the conductive wire 50 is equal to the diameter of the disk with the same surface area as the straight cross-sectional area of the conductive wire 50. According to one embodiment, conductive wire 50 has a diameter ranging from 40 μm to 200 μm, for example equal to approximately 100 μm. According to one embodiment, the conductive wire 50 comprises a conductive core surrounded by an insulating sheath, for example an enameled wire. According to one embodiment, conductive wire 50 forms one coil 52 to twenty coils 52, preferably from two coils 52 to six coils 52.

According to one embodiment, the tapered guide 40, and the support 53 in the embodiment illustrated in FIG. 2, is made of a solid, non-magnetic material, in particular a material selected from the group comprising ceramics, earthenware, porcelain, non-magnetic metals (in particular aluminum, copper or titanium), austenitic steel and non-magnetic metal alloys, in particular aluminum-, copper- and/or titanium-based alloys.

Thanks to its tapered geometric shape, the tapered guide 40 advantageously allows a thermal buffer between the measurement area at end 54 and a reception area at electroacoustic transducer 60 to be performed. The measurement area can then be brought to a high temperature of several hundred degrees Celsius, while the receive area can be subjected to a lower temperature compatible with the temperature range tolerated by the electroacoustic transducer 60.

The acoustic transducer 60 is configured to receive an acoustic wave and provide an analog electrical signal, such as a voltage or current, hereinafter referred to as the measurement signal. The magnitude of the measurement signal depends on the magnitude of the acoustic wave, and is preferably proportional to the magnitude of the acoustic wave. The acoustic transducer 60 receives a packet and provides an electrical measurement signal comprising at least one peak, and generally several positive and negative peaks. Acoustic transducer 60 can be a transverse-wave acoustic transducer. According to one embodiment, acoustic transducer 60 is a piezoelectric transducer or an electromagnetic acoustic transducer. Transducer 60 corresponds, for example, to the piezoelectric transducer marketed by Olympus under the name V153, which can have a center frequency of around 1 MHz.

Figure 4:
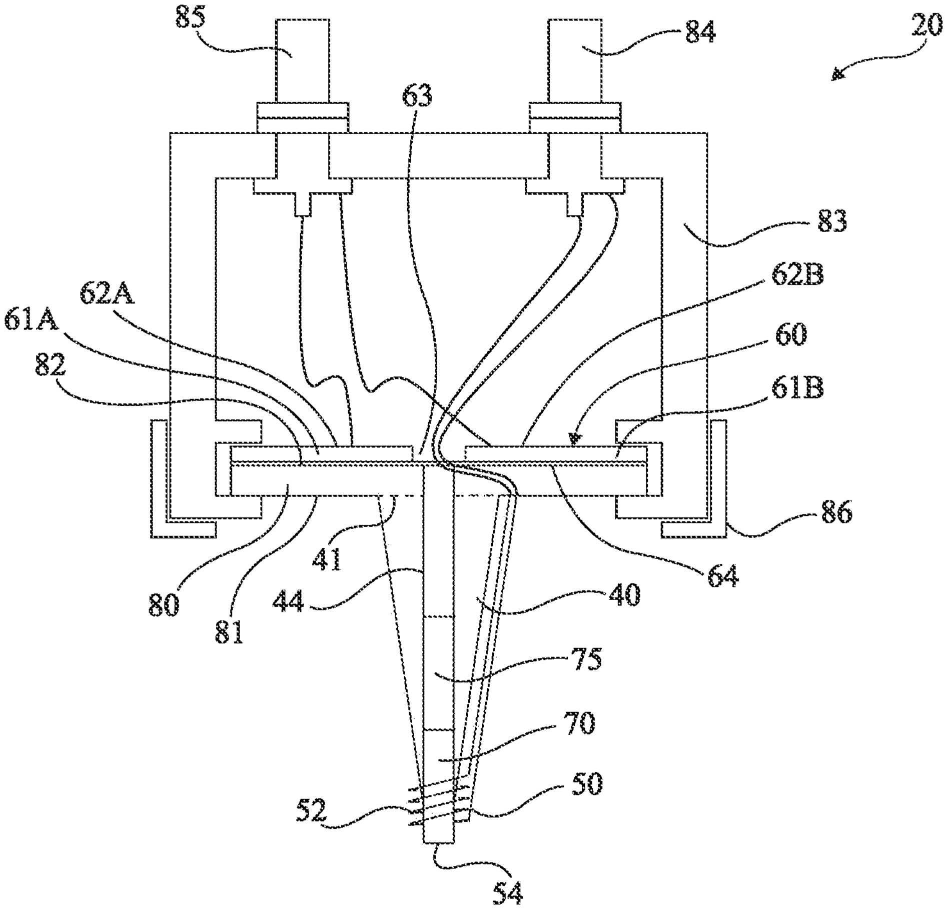
FIG. 4 is a partial schematic cross-sectional view of an alternative embodiment of the probe of the measurement system shown in FIG. 1.
Figure 5:
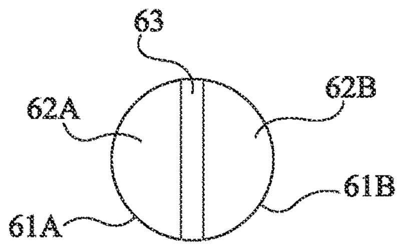
FIG. 5 is a top view of a piece of the probe shown in FIG. 4.

FIG. 4 is a schematic partial cross-sectional view of an alternative embodiment of the probe 20 of the measurement system 10, and FIG. 5 is a top view of an embodiment of the acoustic transducer 60 of the probe 20 shown in FIG. 4.

The probe 20 shown in FIG. 4 comprises all the elements of the probe 20 shown in FIG. 1, and also includes a straight acoustic waveguide 80 interposed between the tapered guide 40 and the electroacoustic transducer 60. The straight acoustic waveguide 80 has a constant straight cross-section, and extends rectilinearly, and is hereinafter referred to as straight guide 80. According to one embodiment, the straight guide 80 extends along the axis D and comprises two opposing faces 81 and 82. The electroacoustic transducer 60 is attached to face 82 of straight guide 80. According to one embodiment, the tapered guide 40 and the straight guide 80 are separate parts. The base 41 of the tapered guide 40 is then attached to the face 81 of the straight guide 80. According to one alternative embodiment, the tapered guide 40 and the straight guide 80 are integrally manufactured. The base 41 of the tapered guide 40 is then included in the face 81 of the straight guide 80. In the embodiment illustrated in FIG. 4, the straight guide 80 has a cylindrical shape with a circular base, and the face 81 of the straight guide 80 has a diameter greater than the diameter of the base 41 of the tapered guide 40.

According to one embodiment, the diameter of the straight guide 80 ranges from 3 mm to 7 mm, and is preferably equal to 4 mm. The thickness of the straight guide 80 ranges from 0.3 mm to 2 mm, and is preferably about 1 mm. The straight guide enables the electroacoustic transducer 60 to be coupled to the tapered guide 40. The diameter of the straight guide 80 dictates the radial bending resonance frequency (typically 1 MHz), while allowing the diameter at the base 41 of the tapered guide 40 to be less than or comparable to one wavelength. According to one embodiment, the height of the tapered guide 40 ranges from 5 mm to 25 mm, and is preferably equal around 10 mm.

The probe 20 further comprises a support 83 for the tapered guide 40, attached to the straight guide 80. According to one embodiment, the support 83 is made of an electrically insulating material, such as plastic, in particular a polymer. According to one alternative embodiment, support 83 is made of an electrically conductive material, such as metal. In particular, the support 83 enables the tapered guide 40 to be handled. The probe 20 further comprises a connector 84 attached to the support 83 and connected to both ends of the conductive wire 50. The probe 20 further comprises a connector 85 attached to the support 83 and connected to the electrodes of the acoustic transducer 60. A ring 86 attached to the support 83 enables the probe 20 to be coupled to a holding system, not shown.

According to one embodiment, opening 44 extends along axis D over the entire height of tapered guide 40, and possibly also over the entire height of straight guide 80. A permanent magnet 75 is located in the opening 44 as an extension of the ferromagnetic rod 70, in contact with the ferromagnetic rod. Permanent magnet 75 is made of NdFeB, for example.

According to a first embodiment, the acoustic transducer 60 comprises two PZT-type piezoelectric ceramic half-discs 61A and 61B separated by a small gap 63 of width 0.1 mm to 0.3 mm, while according to a second embodiment, the transducer is a monolithic PZT ceramic disc. The acoustic transducer 60 comprises, on the top face of each ceramic half-disc 61A, 61B, an upper electrode 62A, 62B, each in the shape of a half-disc. In the monolithic version, the two electrodes 62A and 62B are separated by an insulating guard strip, 0.1 mm to 0.3 mm wide. A single lower electrode 64 coats the bottom faces of the two ceramic half-discs 61A, 61B or the monolithic disc.

According to one embodiment, one of the upper electrodes 62A is the hot spot, while the other upper electrode 62B is connected to the ground of connector 85. The lower electrode 64 has a floating voltage. It uniformly coats the two half-discs 61A, 61B, which are ferroelectric materials the electrical dipole moment of which is herein oriented in the same direction. The lower electrode 64 is used to impose an electric field across the thickness of the half-discs 61A, 61B. This field reverses from one half-disc 61A, 61B to the other. The output signal S is taken between the two upper electrodes 62A, 62B. The direction of sensitivity of the acoustic transducer 60 to the acoustic polarization of the bending wave is oriented perpendicular to the axis defined by the space 63 separating the half-discs 61A, 61B. The space 63 separating the half-discs 61A, 61B is therefore arranged parallel to the conductive track 2 through which the current to be measured flows.

According to one alternative embodiment, the electrical dipole moment of one of the half-discs 61A, 61B is reversed with respect to the other. The lower electrode 64 constitutes the electrical ground. The polarization of the bending wave is also detected in the direction perpendicular to the axis defined by the gap 63 separating the half-discs 61A, 61B. The two upper electrodes 62A and 62B are connected together at the same electrical potential. The output signal S is taken between the upper electrodes 62A and 62B and the lower electrode 64. The arrangement is thus suitable for detecting a bending wave that creates opposing mechanical stresses on the bottom faces of half-discs 61A, 61B, since the two half-discs 61A, 61B would produce the same potential difference between the top electrode and ground if the top electrodes were separate. The top electrodes 62A and 62B can therefore be coupled together to obtain a selective detection of a bending wave oriented perpendicular to the axis defined by the gap 63 separating the half-discs 61A, 61B. By way of example, the straight guide 80 and the support 83 are electrically conductive, and the lower electrode 64 is bonded to the straight guide 80 using an electrically conductive adhesive, such as a conductive epoxy adhesive. The ground return is then achieved via the straight metal guide 80 connected to the support 83 and to which the connector 85 is screwed. The resonant frequency of an alternately polarized PZT electroacoustic transducer 60 with a thickness of 0.2 mm and a diameter ranging from 4 mm to 5 mm is around 1 MHz.

Advantageously, probes 20 according to the embodiment shown in FIGS. 1 and 4 are particularly suited to the asynchronous monitoring and detection of a medium to high value direct or transient electric current, ranging from a few tens of milliamperes to several amperes.

Figure 6:
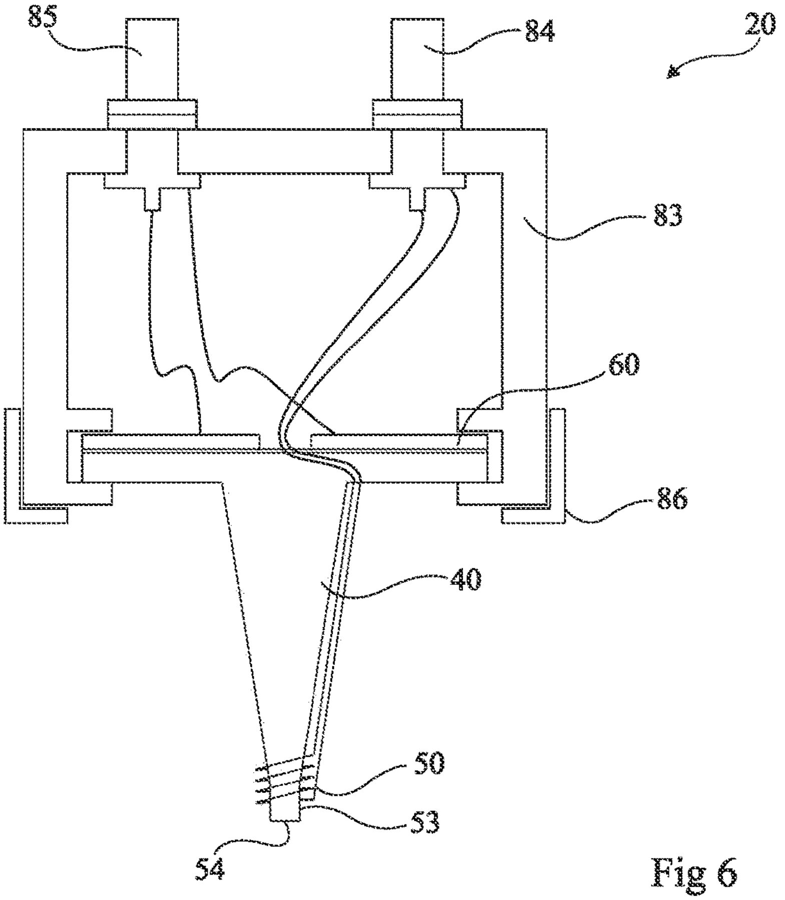
FIG. 6 is a partial schematic cross-sectional view of an alternative embodiment of the probe of the measurement system shown in FIG. 1.

FIG. 6 is a schematic cross-sectional view of an alternative embodiment of the probe 20 of the measurement system 10.

The probe 20 shown in FIG. 6 comprises all the elements of the probe 20 shown in FIG. 4, with the difference that the opening 44, the ferromagnetic rod 70 and the permanent magnet 75 are not present, and that the tapered guide 40 has the shape shown in FIG. 2, with the support 53 for the coils 52 thus corresponding to a cylindrical rod.

Advantageously, probes 20 according to the embodiments illustrated in FIGS. 2 and 6 are more particularly suited to the detection by highly localized and quantified synchronous sampling of a low to high value direct or transient electric current ranging from milliamperes to several amperes.

Figure 7:
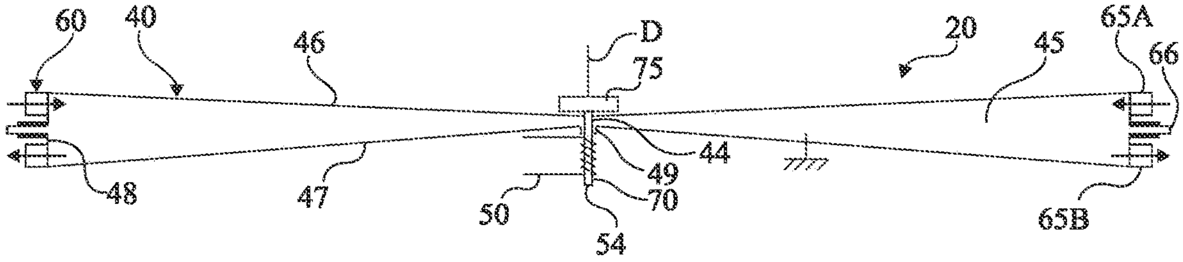
FIG. 7 is a partial schematic cross-sectional view of an alternative embodiment of the probe of a system for measuring an electric current.
Figure 8:
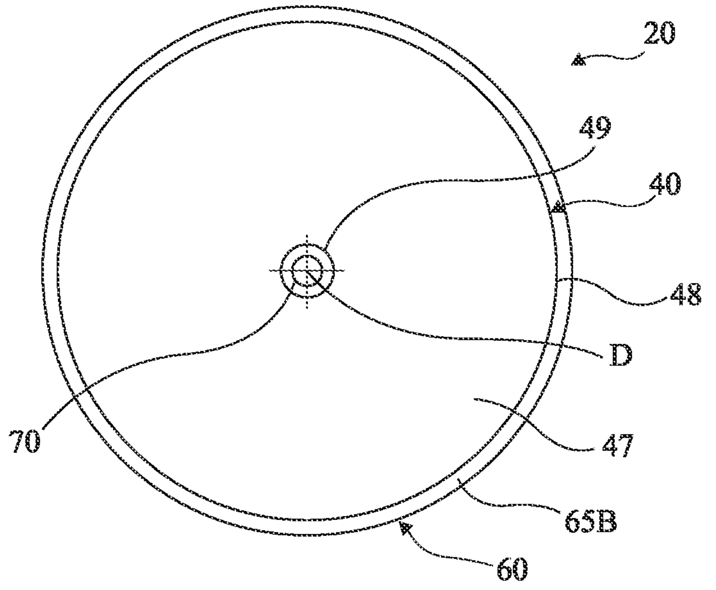
FIG. 8 is a bottom view of the probe shown in FIG. 7.

FIG. 7 is a schematic partial cross-sectional view of an alternative embodiment of the probe 20 of the measurement system 10, and FIG. 8 is a bottom view of the probe 20 shown in FIG. 7. In this embodiment, the waveguide 40 comprises a D-axis-rotationally symmetrical, biconcave portion 45, for example biconical, the thickness of which narrows from the periphery towards the D-axis. The maximum thickness of the biconcave portion 45 is small compared with the diameter of the biconcave portion 45. According to one embodiment, the biconcave portion 45 comprises a top face 46 and a bottom face 47, each being generally frustoconical shaped with axis D and pointing towards the other. The top face 46 and the bottom face 47 are coupled at the periphery of the biconcave portion 45 by an edge 48. The biconcave portion 45 of the waveguide 40 is adapted to resonate in thickness with a polarization perpendicular to the edge 48.

The waveguide 40 further comprises a tubular portion 49 of axis D projecting from the bottom face 47 of the biconcave portion 45. Opening 44 extends into tubular portion 49 and into biconcave portion 45. The rod 70 is partly housed in the opening 44, and projects outside the opening 44 along the axis D on the side of the bottom face 47. As in the embodiments shown in FIGS. 1 and 4, the coils 52 of the conductive wire 50 are wound around the part of the ferromagnetic rod 70 located outside the opening 44.

The biconcave portion 45 is inscribed in a cylinder with a circular base and a axis D, the ratio of height to diameter of which is less than 5, preferably 10. By way of example, the diameter of the biconcave portion 45 can be between 10 mm and 50 mm, for example 20 mm in diameter. The thickness of biconcave portion 45 at edge 48 can be between 1 mm and 5 mm, for example equal to 2.7 mm. The thickness of the biconcave portion 45 at the thinnest point of the connection to the tubular portion 49 can be between 0.3 mm and 1 mm, for example 0.4 mm. The diameter of opening 44, and therefore the diameter of ferromagnetic rod 70, can be between 0.5 mm and 5 mm, for example 0.75 mm. The external diameter of the tubular portion 49 can be between 1 mm and 6 mm, for example 1.2 mm. The height of the ferromagnetic rod 70 is of the order of 1 mm. The end 54 of ferromagnetic rod 70 can be sharpened.

In the present embodiment, the permanent magnet 75 is located on the top face 46 of the biconcave portion 45. Advantageously, the dimensions of permanent magnet 75 in the present embodiment may be larger than the dimensions of permanent magnet 75 in the embodiment of probe 20 illustrated in FIG. 4. Permanent magnet 75 is in direct physical contact with ferromagnetic rod 70. By way of example, the permanent magnet 75 corresponds to a cylinder the diameter of which ranges from 1 mm to 10 mm, preferably from 2 mm to 3 mm, which provides a static magnetic field of typical value 0.5 T at the North or South face of the permanent magnet 75 and a limited decrease in the field transmitted to the end 54 of the ferromagnetic rod 70 so that the magnitude of the magnetic field produced locally at the track 2 reaches or exceeds 100 mT to 300 mT.

The bending of the end 54 of the probe 20, under the effect of the Lorentz force, is transmitted in the form of a tilting of the axis of the tubular portion 49. This generates a dipolar-type, circular wave which is antisymmetric with respect to the median plane of the biconcave portion 45 of the guide 40, and propagates up to the edge 48 of the guide 40.

In the present embodiment, the acoustic transducer 60 is located at the edge 48 of the biconcave portion 45. The acoustic transducer 60 comprises an upper half-ring 65A made of PZT and a lower half-ring 65B made of PZT arranged opposite each other. Each half-ring 65A, 65B coats at most half the thickness of the edge 48. Each half-ring 65A, 65B has an electric dipole moment that is reversely polarized with respect to the other. The positioning of the half-rings 65A, 65B on part of the edge 48 can be facilitated by a collar 66 separating the edge 48 into an upper portion and a lower portion. The half-rings 65A, 65B can be attached to the guide 40 by gluing. The acoustic transducer 60 resonates in thickness with a polarization perpendicular to the edge 48 of the biconcave portion 45. Half-rings 65A, 65B are electrically connected in parallel, and the boundary plane of half-rings 65A, 65B passing through the center of the rings must be oriented perpendicular to the direction of flow of the current to be measured. As a result, electroacoustic transducer 60 is configured to detect an antisymmetrical plate wave, such as the antisymmetrical Lamb mode A0 that would be generated mainly in a guide of constant thickness. Here, however, the biconcave portion 45 of the guide 40 is thinned, which reduces its radiation impedance at the center of the biconcave portion 45 at the level of the contact of the end 54 with the track 2 to be probed, so that the mechanical load of the track 2 by the end 54 of the probe 20 is very largely imposed by the mechanical impedance of the printed circuit board 3. The waveguide 40 constitutes the electrical ground if it is made of electrically conductive material. For a thickness of 1 mm, the resonance of half-rings 65A, 65B is around 1.2 MHz and the transit time of ultrasonic waves between tubular portion 49 and half-rings 65A, 65B is around 3.5 μs.

As an alternative, the upper and lower half-rings 65A, 65B can be extended to full rings subject to reverse the polarization of the half-rings lying in the same plane, each being responsible for detecting one half of the dipolar, circular, anti-symmetrical wave propagating in the guide 40. In that case, the four half-rings can be connected in parallel, with all four receive signals being in phase.

According to one simplified embodiment, the permanent magnet 75 can be placed directly under the printed circuit board 3 in line with the track 2 to be probed, i.e. on the side of the printed circuit board 3 opposite the guide 40. However, this has the drawback of distributing the magnetic field lines over the entire thickness of the printed board 3, which can generate parasitic ultrasonic waves in the case of a multilayer printed circuit board 3.

Further, this approach also produces a magnetic field that extends over a larger lateral area of the printed circuit board 3, making it impossible to accurately determine the magnetic field value at the track 2 to be probed, unless a local measurement is made using a magnetometer probe.

Advantageously, the probe 20 shown in FIGS. 7 and 8 enables maximizing the static magnetic field in the vicinity of the electrical track 2.

Figure 9:
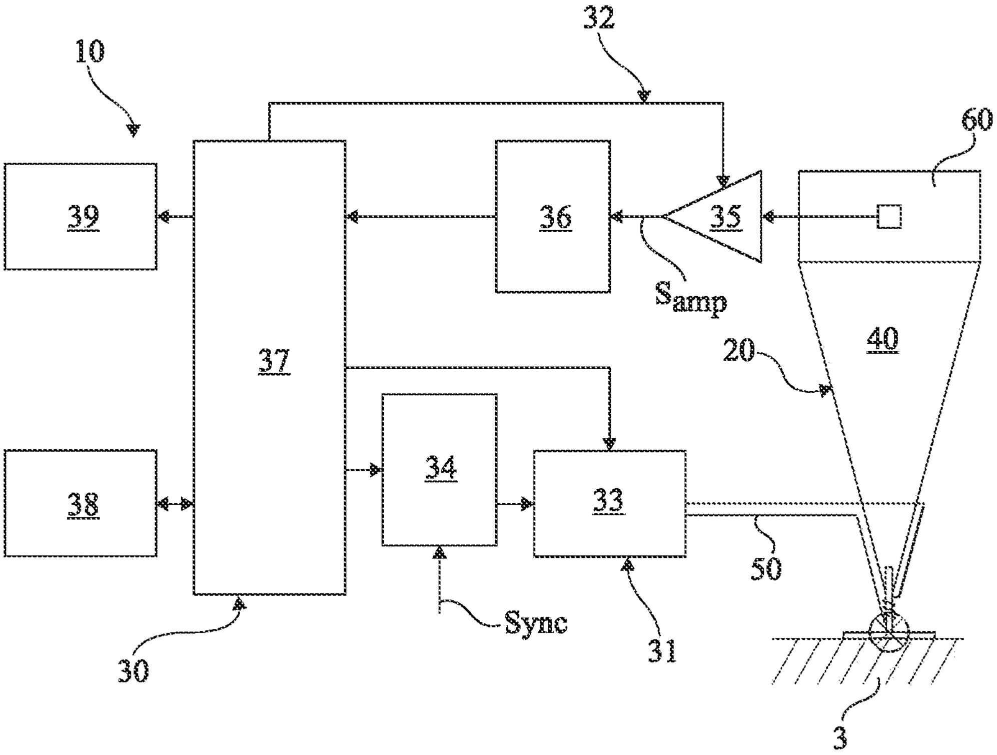
FIG. 9 is a block diagram of the detection system shown in FIG. 1, illustrating embodiments of the control and acquisition device of the system for measuring an electric current.

FIG. 9 illustrates a block diagram of the detection system 10, illustrating an embodiment of the control and acquisition device 30. According to one embodiment, electroacoustic transducer 60 is a piezoelectric transducer.

Particularly, the control and acquisition device 30 comprises a control chain 31 and an acquisition chain 32. The control chain 31 comprises:

- a generator 33 of current pulses in the conductive wire 50 coupled to both ends of the conductive wire 50; and
- a control module 34 for the current pulse generator 33, receiving a synchronization signal Sync.

The acquisition chain 32 comprises:

- a programmable amplifier 35 receiving the analog measurement signal S provided by the electroacoustic transducer 60, and providing an amplified analog measurement signal Samp substantially equal to the measurement signal S multiplied by an amplification gain G; and
- a processing module 36 receiving the amplified measurement signal provided by amplifier 35.

The control and acquisition device 30 further comprises:

- a microcontroller 37 coupled to amplifier 35, processing module 36, control module 34, and generator 33;
- a computer 38 coupled to microcontroller 37; and
- a human-machine interface 39 coupled to the microcontroller 37 and/or the computer 38, and comprising particularly a display screen.

As an alternative, the control module 34 and/or the processing module 36 can be integrated into the microcontroller 37.

The control and acquisition device 30 illustrated in FIG. 9 is configured to generate a current pulse in the conductive wire 50 with intensity Iz and duration Δt, possibly occurring after the elapse of a delay T subsequent to a pulse of the synchronization signal Sync in the case of synchronous measurement.

Computer 38 is configured to exchange signals with microcontroller 37, for example via a UART (Universal asynchronous receiver-transmitter) port, including particularly values for delay T, duration Δt, current I, and the gain value G of programmable amplifier 35.

According to one embodiment, the value of gain G of the programmable amplifier 35 is determined from the intensity of the current I determined during the previous measurement. The lower the intensity I determined during the previous measurement, the higher the value of gain G, for example in steps corresponding to intensity I measurement ranges.

According to one embodiment, launching the measurement process occurs based on the synchronization signal Sync if the measurement is synchronous. According to one alternative embodiment, launching the measurement process occurs automatically and periodically with a user-defined measurement period if the measurement is asynchronous. In this case, the measurement period is preferably longer than the damping time of the acoustic pulse propagating in the tapered guide 40 due to the preceding current pulse.

According to one embodiment, the generator 33 applies a current pulse of intensity Iz in the conductive wire 50 coupled to the tapered end 42 of the tapered guide 40 with a delay T and duration Δt defined in the control module 34. In the presence of a current I in the conductive track 2, an ultrasonic acoustic wave travels up from the tapered end 42 towards the base 41 of the tapered guide 40. The acoustic wave is converted into an electrical measurement signal S by the acoustic transducer 60 coupled to the base 41, and the electrical measurement signal S is amplified by the programmable amplifier 35 to provide the amplified measurement signal $S_{amp}$.

According to one embodiment, the processing module 36 is configured to detect the peak magnitude of the amplified measurement signal Samp and provide an analog value of the detected peak magnitude to the microcontroller 37. According to one embodiment, the processing module 36 is further configured to determine a binary value Polar I/O representative of the positive or negative sign of the first pulse of the amplified measurement signal $S_{amp}$. Indeed, the phase of the acoustic wave changes by 180° depending on whether the electric current I flows in one direction or the opposite direction. The microcontroller 37 may further include an analog/digital converter adapted to receive the analog value of the detected peak magnitude and provide a digital signal of the peak magnitude.

According to one embodiment, the microcontroller 37 is configured to receive the amplified measurement signal $S_{amp}$ directly and to perform a sampling of the amplified measurement signal $S_{amp}$, for example with a depth of 10 to 16 bits and at a rate of 5 to 12 mega samples per second over a time window of 1 us to 100 μs. According to one embodiment, the microcontroller 37 is configured to perform an interpolation of the measurement points so as to finely reconstitute the amplified measurement signal and obtain a precise value for the peak magnitude and phase of the amplified measurement signal.

According to one alternative embodiment, the microcontroller 37 is configured to determine the Fourier transform of the amplified measurement signal $S_{amp}$. Preferably, the Fourier transform is determined from the time trace of the amplified measurement signal $S_{amp}$ including the peaks of the amplified measurement signal $S_{amp}$ and excluding the parasitic coupling of the current or voltage pulse so that only the peaks due to the reception of the acoustic wave packet by the transducer 60 with a zero measurement signal before its arrival and after its arrival remain in the time trace.

According to one embodiment, the amplified measurement signal $S_{amp}$ is processed so that its values are zero after the fourth or fifth zero crossing of the amplified measurement signal $S_{amp}$, which corresponds to the time when most of the acoustic wave packet has been received by the transducer 60 and the tail of the acoustic wave packet is entered. The spectral line of maximum magnitude in the spectrum obtained corresponds to the center frequency of the acoustic wave packet. The magnitude of the spectral line is representative of the maximum magnitude value of the amplified measurement signal $S_{amp}$.

Determining the peak magnitude of the amplified measurement signal $S_{amp}$ from the Fourier transform of the amplified measurement signal $S_{amp}$ rather than directly from the amplified measurement signal $S_{amp}$ is more accurate and more independent of the analog noise present in the amplified measurement signal $S_{amp}$, thus enabling access to low current intensities. In these extreme cases, sensitivity is increased by replacing the current pulse with a train of pulses, comprising for example 2 to 10 pulses and preferably 4 equidistant current pulses, with a carrier centered on the center frequency of the electromechanical transducer 60. Further, the Fourier transform of the amplified measurement signal $S_{amp}$ is independent of the propagation time of the acoustic waves in the tapered guide 40. The effect of a change in the temperature of the tapered guide 40 is therefore limited to an advance or delay in the arrival of the acoustic wave packet at the transducer 60, i.e. simply a phase change in Fourier space.

Microcontroller 37 is configured to determine electric current intensity I by multiplying the peak value by a calibration coefficient. The electric current intensity I and its direction of flow are displayed on display 39 in a selected unit of measurement or transmitted to computer 38 for further processing. The electroacoustic transducer 60 is oriented so that the acoustic polarization is perpendicular to the conductive track 2 in which the electric current I to be measured flows, and points in its direction. The signal is then said to flow from left to right or right to left, depending on the polarization of the acoustic wave, which is related to the classical conventions of current flow from a higher to a lower potential.

According to one embodiment, the control and acquisition device 30 can drive one, two or more probes 20, arranged at various points on the printed circuit board 3 carrying different current signals, from the same synchronization signal Sync, each of the probes 20 being able to be excited with the same or a different delay T in relation to the other probes 20, so that spatial and temporal sampling can be multiplied by the number of probes 20 used. If several probes 20 are excited with slightly different T delays and arranged at virtually the same place of a conductive track in which a fast alternating or transient electric current flows, the number of sampling points for the electric current can be multiplied by the number of probes 20 used.

Figure 10:
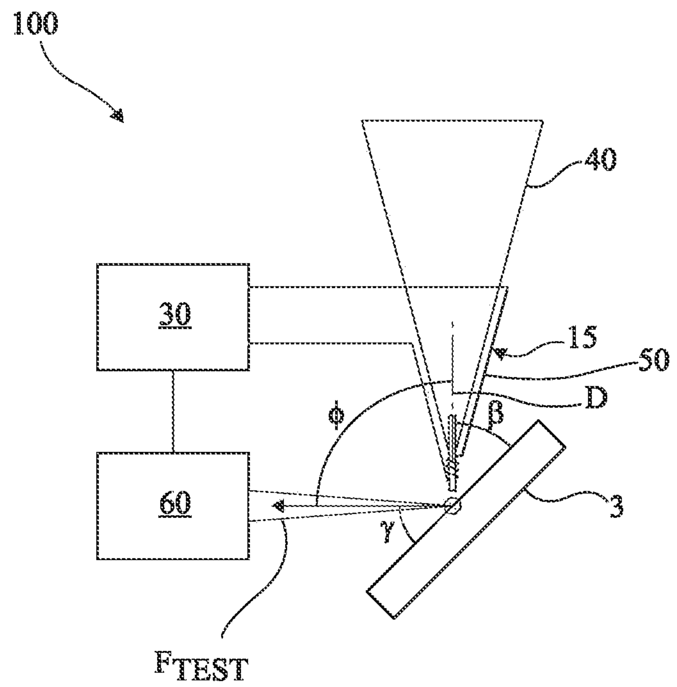
FIG. 10 is a partial schematic cross-sectional view of a further embodiment of a system for measuring an electric current.

FIG. 10 is a schematic partial cross-sectional view of a further embodiment of a system for measuring an electric current 100. The system for measuring an electric current 100 comprises all the elements of the system for measuring an electric current 10 shown in FIG. 1, with the difference that the mechanical wave sensor 60 is a contactless vibration measuring sensor. The control and acquisition device 30 is coupled to the conductive wire 50 of the device 15 for generating a magnetic field and to the contactless vibration sensor 60. According to one embodiment, the contactless vibration sensor 60 is a laser vibrometer. The measurement system 100 enables contactless electrical current measurement to be performed. Further, the bandwidth of the measurement system 100 can be higher than the bandwidth of the measurement system 10 shown in FIG. 1.

The method for generating the local active or passive magnetic field is identical to that described above. The laser vibrometer 60 performs a contactless mechanical displacement measurement at the point where the pulsed magnetic field is strongest.

Figure 11:
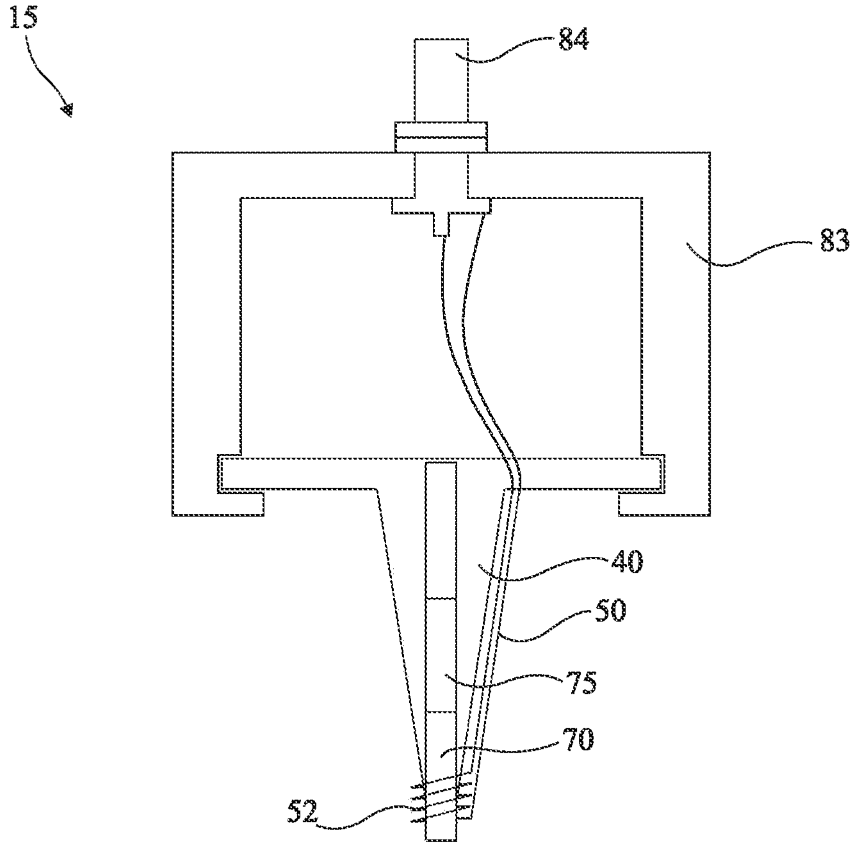
FIG. 11 is a partial schematic cross-sectional view of another embodiment of the device for generating the magnetic field of the measurement system shown in FIG. 10.

FIG. 11 is a partial schematic cross-sectional view of another embodiment of the device 15 for generating a magnetic field of the measurement system 100 shown in FIG. 10. The device 15 for generating a magnetic field shown in FIG. 11 comprises all the elements of the probe 20 shown in FIG. 4, with the difference that the acoustic transducer 60 and connector 85 are not present.

Figure 12:
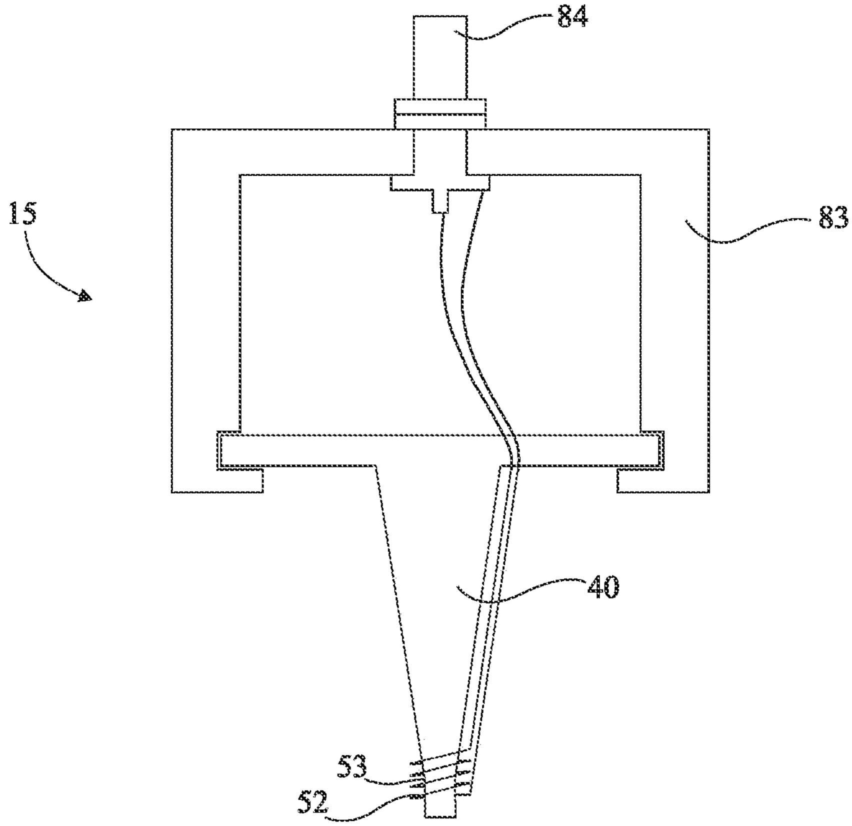
FIG. 12 is a partial schematic cross-sectional view of a further embodiment of the device for generating the magnetic field of the measurement system shown in FIG. 10.

FIG. 12 is a partial schematic cross-sectional view of a further embodiment of the device 15 for generating a magnetic field of the measurement system 100 shown in FIG. 10. The device 15 for generating a magnetic field shown in FIG. 12 comprises all the elements of the probe 20 shown in FIG. 6, with the difference that the acoustic transducer 60 and the connector 85 are not present.

The laser vibrometer 60 enables contactless vibration measurements of the surface of the printed circuit board 3 to be performed. The laser vibrometer 60 emits a laser beam FTEST which is directed towards the surface of the printed circuit board 3 at the location of the conductive track 2 in which the electric current to be measured flows, and the vibration magnitude and frequency are extracted from the Doppler shift in the frequency of the reflected laser beam due to the movement of the surface of the printed circuit board 3. The laser vibrometer 60 may correspond to a two-beam laser interferometer that measures the frequency (or phase) difference between an internal reference beam and a test beam. The test beam FTEST is directed towards the surface of the printed circuit board 3, and light scattered from the surface of the printed circuit board 3 is collected and interfered with the reference beam on a photodetector, for example a photodiode. Most commercial vibrometers operate in the heterodyne regime by adding a known frequency offset (typically 30 MHz to 70 MHz) to one of the beams. This frequency offset is usually generated by a Bragg cell or acousto-optic modulator.

Figure 13:
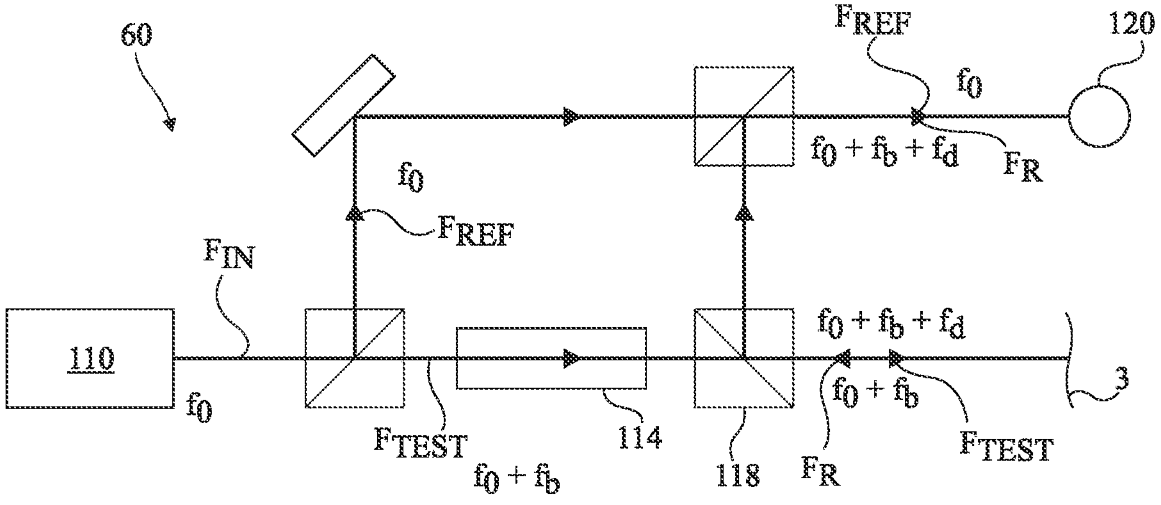
FIG. 13 illustrates a partial schematic of an example of a laser vibrometer.

FIG. 13 is a block diagram of an embodiment of the laser vibrometer 60. The laser vibrometer 60 comprises a source 110 of a laser beam $F_{IN}$ at a frequency fo. The laser beam $F_{IN}$ is split into a reference beam $F_{REF}$ and a test beam $F_{TEST}$ with a beam splitter 112. The test beam $F_{TEST}$ then passes through the Bragg cell or an acousto-optic modulator 114, adding a frequency shift fb. The frequency-shifted beam $F_{TEST}$ is then directed towards the surface of the printed circuit board 3 at the location of the conductive track 2 in which the electric current to be measured flows. Movement of surface of the printed circuit board 3 adds a Doppler shift fd to the reflected beam $F_R$.

Light irradiates from the surface of the printed circuit board 3 in all directions, but some of the light is collected by the laser vibrometer 60 and reflected by a beam splitter 118 towards a photodetector 120. This light has a frequency equal to fo+fb+fd. This scattered light is combined with the reference beam $F_{REF}$ at photodetector 120. The output of photodetector 120 is a standard frequency (FM) modulated signal S, with frequency fb as the carrier frequency and Doppler shift fd as the modulation frequency. This signal S can be demodulated by the control and acquisition device 30 to obtain the speed versus time of the surface of the printed circuit board 3.

The laser vibrometer 60 is adapted to detect a mechanical vibration of the printed circuit board 3 outside the plane of the printed circuit board 3. To obtain such an oscillation of the printed circuit board, the axis D of the device 15 for generating a magnetic field is tilted with respect to the direction orthogonal to the plane of the printed circuit board 3. To improve the reflection of the laser beam by the surface of the printed circuit board 3, the latter can be locally coated with a reflective coating, for example a reflective metallized mylar adhesive pad or a back-scattering microbead adhesive pad.

In operation, the magnetic field is applied to the track 2 to be probed. The Lorentz force generates an out-of-plane displacement of the surface of printed circuit board 3 at track 2 to be probed. The optical path of the reflected laser beam is modified by the ultrasonic vibration generated by the Lorentz force.

The axis of the component Bz of the magnetic field is tilted with respect to the direction orthogonal to the plane of printed circuit board 3. Similarly, the axis of the test laser beam $F_{TEST}$ is tilted with respect to the direction orthogonal to the plane of printed circuit board 3. The axis of the field Bz and the axis of the test laser beam form an angle σ with each other. We call β the angle between axis D and the surface of printed circuit board 3 and γ the angle between test laser beam $F_{TEST}$ and the surface of printed circuit board 3. The current I to be measured is in a direction perpendicular to the plane containing laser beam $F_{TEST}$ and axis D. The more the axis D is tilted at a small angle β, the more an out-of-plane displacement component is generated and detected relative to the plane of the printed circuit board 3. The optical method aims to detect an out-of-plane displacement component by ensuring that the angle σ between the test beam and the plane of the printed circuit board 3 is close to 90°, while the angle β is close to 0°. An experimental compromise can be found with β worth 45° and γ worth 90°, which corresponds to a laser beam incident perpendicular to the surface of printed circuit board 3 and an axis of the magnetic field Bz obliquely incident at 45°. But in this case, the measurement must be corrected by multiplying it by the root of two, to take into account the reduction in the Doppler effect as β increases from 0 to 90°, here 45° corresponding to the tilt of the axis of the field Bz.

The system for measuring the current according to the previously described embodiments allows an electric current flowing through a circuit to be identified and quantified in a very short time of less than a microsecond. The system for measuring the current can be used both to isolate a signal of interest in a circuit or to detect abnormal consumption, for example by monitoring a pin of an electronic component, or to implement a means of synchronization with electrical signals present in an electronic system. The system for measuring the current thus allows areas and times of high current consumption in a circuit and, by extension, current consumption profiles at particular locations in a circuit to be identified.

An example of the application of the embodiments of the system for measuring an electric current previously described concerns particularly the measurement of the electrical current of switching power supplies, which are very often found in printed circuit boards and are sources of switching with high currents. Further, the operation frequencies of switching power supplies are typically between 50 kHz and 5 MHz, with a large number of circuits switching around 1 MHz. This spectrum is compatible with the previously described embodiment using a point-contact current probe 20 using a transverse-wave ultrasonic transducer, as well as the most common laser vibrometers.

Another example of the application of the embodiments of the system for measuring an electric current described above concerns the measurement of the electrical current of the supply pins of electronic components, in particular the pins of SMD components (Surface Mounted Components), which can be set in ultrasonic vibration according to a lateral bending mode when a magnetic field orthogonal to the plane of the printed circuit board is applied. This type of vibration is perfectly well detected by a transverse wave tip transducer.

Another example of the application of the embodiments of the system for measuring an electric current described above concerns the monitoring of current consumption in an electronic circuit development phase requiring optimization of the value of an electronic component, such as a resistor, inductance, transistor or thyristor in power electronics, particularly in a switching circuit or switching transistor.

The embodiments of the system for measuring the magnetic field described above enables a transient or oscillating electric current to be sampled synchronously, with a high degree of spatial localization and also a high degree of temporal localization via a very short sampling period. In particular, the spatial measurement resolution can be less than 0.1 mm, and the sampling time can be less than 10 ns. In particular, it is thus possible to synchronously quantify or simply detect contactlessly and asynchronously pulsed electrical currents with a minimum duration of around 10 ns, or variable electrical currents with a maximum frequency of the order of 100 MHz.

Figure 14:
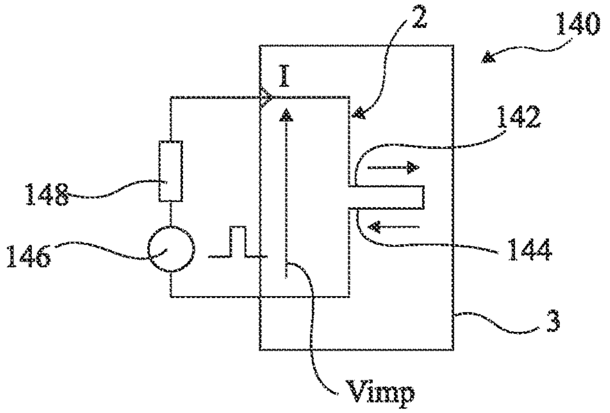
FIG. 14 is a schematic diagram of an electrical circuit used to perform tests.

First, second, third, fourth, fifth, and sixth tests were carried out. FIG. 14 illustrates schematically the electronic circuit 140 used for the tests. The electronic circuit 140 comprises the printed circuit board 3, which is a single-layer printed circuit board, the substrate of which made of standard epoxy glass material $F_R4$ has a thickness of 1 mm. The conductive track 2 to be probed of the printed circuit board 3 is coated with an insulating varnish having a thickness equal to 25 μm. Conductive track 2 is a copper track with a thickness of 35 μm. Conductive track 2 is arranged in a "U" shape comprising two branches forming a forward track 142 and a return track 144 in series. The distance between the two tracks 142 and 144 of the "U" is 150 μm, and the forward track 142 and the return track 144 are each 150 μm wide and 10 mm long. A function generator 146 delivers a rectangular voltage pulse through an output resistor 148 of 50 Ohm. $V_{imp}$ is the voltage applied across conductive track 2.

For all tests, probe 20 was used to measure the current flowing through track 2 of electronic circuit 140 shown in FIG. 14. The probe 20 used for the tests corresponds to the embodiment previously described in relation to FIG. 1. For the tests, the permanent magnet 75 is placed on the bottom face of the printed circuit board 3. The permanent magnet 75 is an NdFEB magnet of cylindrical shape with a circular base and a diameter equal to 10 mm, adapted to provide a magnetic field Bz equal to 0.45 T, which results in the formation of a residual field of 275 mT in the conductive track 2 in which the electric current 3 to be measured flows, i.e. at a distance corresponding to the 1 mm through thickness of the printed circuit board 3.

For all tests, the electroacoustic transducer 60 is the piezoelectric transducer marketed by Olympus under the name V153, centered on 1 MHz. It is a transverse-wave ultrasonic transducer. For all tests, the tapered guide 40 is made of duralumin, an alloy based on aluminum (95%), copper (4%), magnesium (0.5%), and manganese (0.5%).

For all tests, the height of the tapered guide 40, measured along the axis D, is equal to 40 mm. The angle at the apex of tapered guide 40 is 7.8°. The diameter of the base 41 of the tapered guide 40 is 5.5 mm. The electroacoustic transducer 60 is attached to the tapered guide 40 by bonding, using a cyanoacrylate adhesive. Conductive wire 50 is an enameled copper wire wound around support 53 and bonded to support 53 with cyanoacrylate resin. Conductive wire 50 has a diameter of 100 μm. For all tests, the amplification gain of the programmable amplifier 35 is equal to 48 dB. For all tests, the measured signals are averaged over 16 acquisitions.

For all tests, the current pulse passing through the coils 52 of the conductive wire 50 has a duration Δt equal to 400 ns and an intensity I equal to 50 A. The probe 20 is always oriented in the same direction with respect to the printed circuit board, the axis of the tapered guide 40 is perpendicular to the plane of the printed circuit board 3, and sensitivity to bending waves is in a direction perpendicular to the axis of the legs. Transit time in the tapered guide 40 is approximately 13 μs.

For the first, second, fourth, and sixth tests, generator 146 delivers a voltage pulse of peak value 5 Vc across output resistor 148 of 50 Ohms, so that the current flowing through conductive track 2 has a peak current equal to approximately 96 mA.

For the first, second, and third tests, the end 54 of the probe 20 is successively placed in translation at the center of the forward track 142 and then the return track 144 of the electronic circuit 140.

Figure 15:
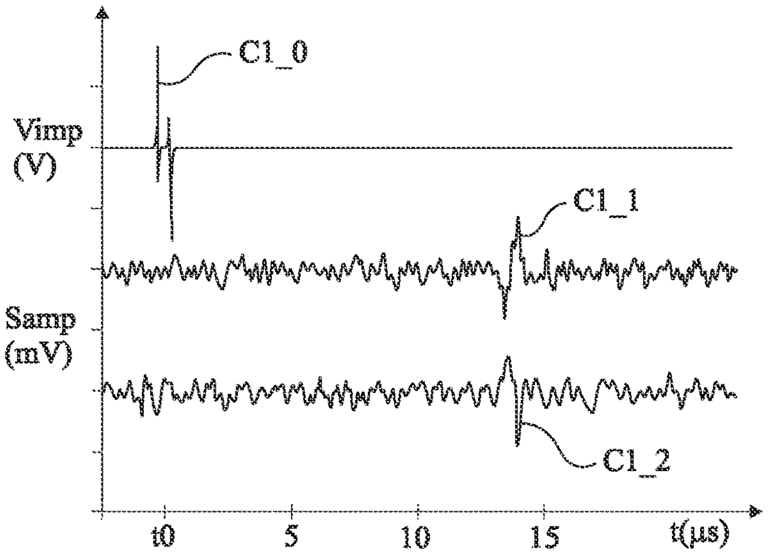
FIG. 15, FIG. 16, and FIG. 17 illustrate curves showing the evolution according to time for the measurement signal provided by the system for measuring an electric current shown in FIG. 1.

FIG. 15 illustrates curves C1-1 and C1-2 showing the evolution as a function of time for the amplified measurement signal $S_{amp}$ provided by amplifier 35 of detection system 10 for the first test. Curve C1-1 is obtained when the probe 20 is brought into contact with the forward track 132, and curve C1-2 is obtained when the probe 20 is brought into contact with the return track 134. FIG. 15 further illustrates a curve C1-0 corresponding to the voltage $V_{imp}$ applied to track 2. On the y-axis, the scale is 2 V/grease for curve C1-0 and 2 mV/grease for curves C1-1 and C1_2. Time to corresponds to the sending of the synchronization signal Sync. In the first test, generator 136 provides a single pulse. It can be seen that the Lorentz force is reversed by reversing the direction of the current between the forward track 132 and the return track 134. Further, it can be seen that the reception signal remains broadband. It corresponds to a horizontal transverse wave (TH) generated within track 2 and transmitted to the tapered tip of the tapered guide 40. The first test highlights that a current pulse is detected almost flowing through a narrow conductive track 132 located at a short distance from another narrow conductive track 134 through which a current flows in the opposite direction.

The second test is carried out under the same conditions as the first, with the difference that generator 136 provides five successive pulses at a center frequency of 1 MHz, corresponding to the frequency of maximum sensitivity of acoustic transducer 60.

Figure 16:
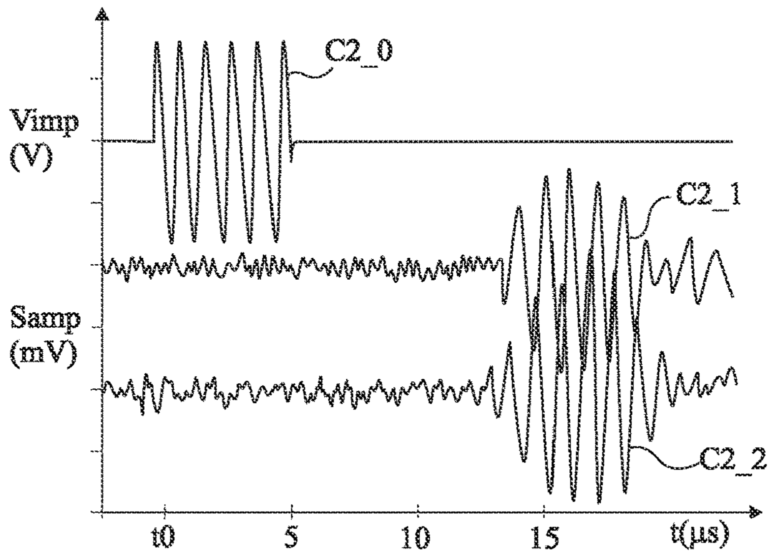

FIG. 16 illustrates curves C2-1 and C2-2 showing the evolution as a function of time of the amplified measurement signal $S_{amp}$ provided by amplifier 35 of detection system 10 for the second test. Curve C2-1 is obtained when the probe 20 is brought into contact with the return track 132, and curve C2-2 is obtained when the probe 20 is brought into contact with the return track 134. FIG. 16 further illustrates a curve C2-0 corresponding to the $V_{imp}$ voltage of 200 mVc applied to track 2, the impedance of which, approximately 2.1 Ohms, is made up of an inductive part linked to the U and a resistive part linked to the copper wire, and which is a fraction of the electromotive force of 5 Vc produced by generator 146. On the y-axis, the scale is 100 mV/grease for curve C2-0 and 2 mV/grease for curves C2-1 and C2_2. It can be seen that each output signal C2-1 and C2-2 reproduces the excitation pulse train fairly faithfully. The two output signals C2-1 and C2-2 are in phase opposition, corresponding to opposite Lorentz forces. The peak-to-peak magnitude of the output signal is 5.4 mV, bringing the amperometric sensitivity of probe 20 to 18 mA per mV of output signal for a local magnetic field Bz of 275 mT.

The third test is carried out under the same conditions as the second test, with the difference that generator 146 provides two series of five pulses, the first series corresponding to a current flowing through conductive track 2 with a peak intensity equal to 96 mA, and the second series corresponding to a current flowing through conductive track 2 with a peak intensity equal to 192 mA.

Figure 17:
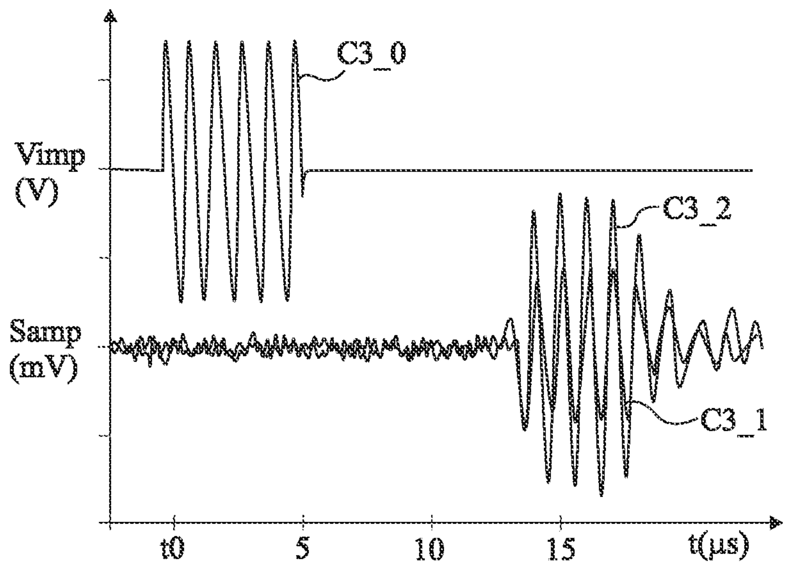

FIG. 17 illustrates the curves C3-1 and C3-2 showing the evolution as a function of time of the amplified measurement signal $S_{amp}$ provided by amplifier 35 of detection system 10 for the third test. Curves C3-1 and C3-2 are both obtained when the probe 20 is brought into contact with the forward track 132 for the first and second series of pulses, with the difference that the pulse height of the generator 146 is 5 Vc for curve C3-1 and 10 Vc for curve C3_2. FIG. 17 further illustrates a curve C3-0 corresponding to the voltage $V_{imp}$ of 200 mVc associated with curve C3-1 and applied to track 2 for the first series of pulses. On the y-axis, the scale is 100 mV/grease for curve C3-0 and 2 mV/grease for curves C3-1 and C3_2. It can be seen that the magnitude of the output signal rises from 5.3 mVcc for curve C3-1 to 10.1 mVcc for curve C3_2, which, within measurement errors due to residual noise, respects the proportionality between the magnitude of the current and the magnitude of the ultrasonic signal associated with the Lorentz force.

A fourth test is carried out to determine the evolution of the magnetic field generated in the axis D of probe 20 as a function of distance from the end of probe 20.

Figure 18:
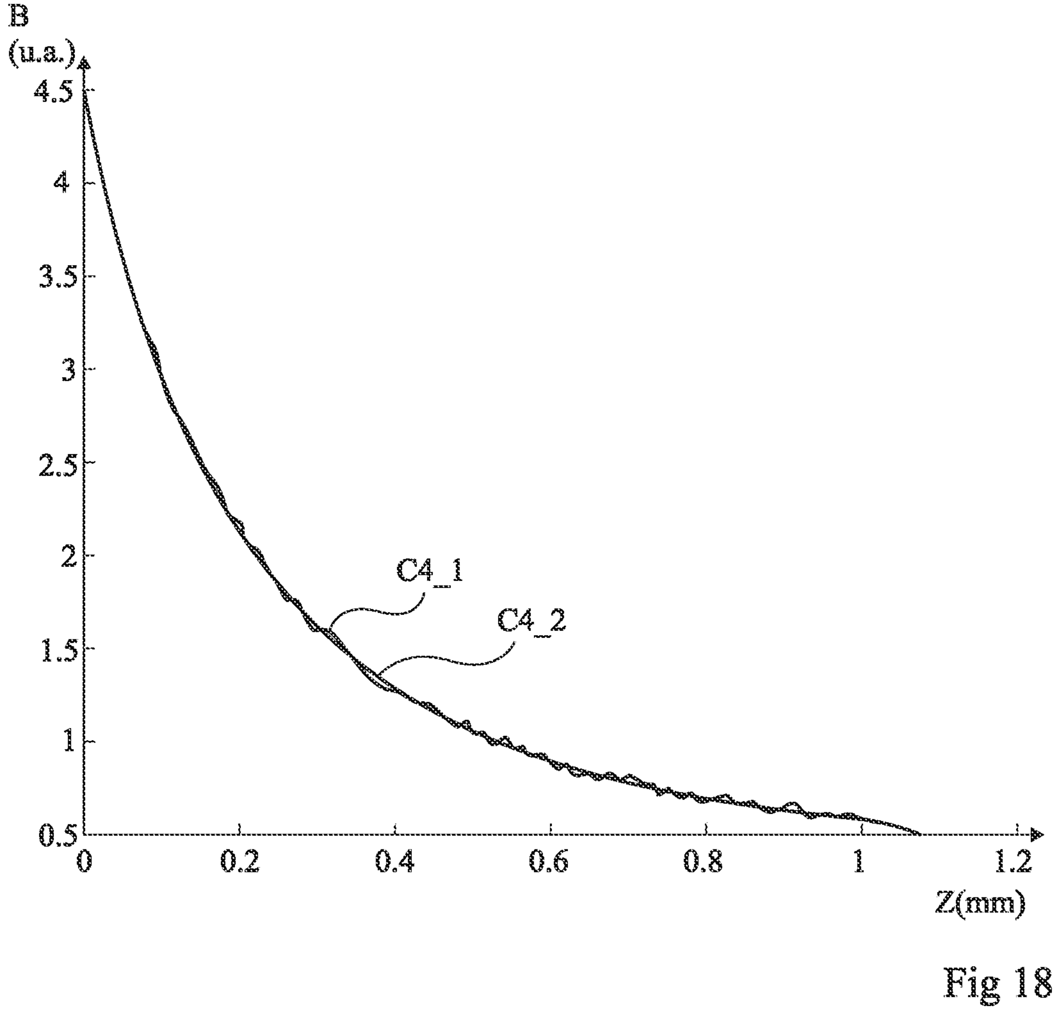
FIG. 18, FIG. 19, and FIG. 20 illustrate curves showing the evolution for the magnetic field generated by the probe of the system for measuring an electric current obtained during tests.

FIG. 18 illustrates curves C4-1 and C4-2 for the decrease of the component Bz of the magnetic field, in arbitrary units, generated in the axis D of probe 20 as a function of distance from the coil 52 closest to the end 54 of probe 20. Curve C4-1 is obtained by testing. Curve C4-2 is a polynomial curve following curve C4_1. Probe 20 consists of five coils 52 made from enameled copper wire 50 with a diameter of 40 μm, disposed on support 53 with a diameter of 200 μm, the assembly having a diameter (center of wire to center of wire) of coils 52 being approximately 250 μm. The magnetic field is measured by any known magnetic field sensor. Curve C4-1 gives an experimental indication of the decrease in the pulsed magnetic field Bz as a function of the thickness of the coating, for example a layer of varnish, covering the conductive track 2. It can be seen that when the coating thickness reaches approximately the diameter of the coils 52, the magnetic field is reduced by roughly half. By way of example, when the coils 52 have a diameter of 250 μm, and a coating with a thickness of 25 μm between the end 54 of the probe 20 and the copper track 2 creates an offset on the value of the magnetic field of 8%, and therefore of the current measurement. Curve C4-2 can be used as an abacus providing the decrease of the magnetic field component Bz as a function of the distance between the conductive track 2 of the printed circuit board 2 and the last coil 52 (closest to the printed circuit board) of probe 20.

A fifth test is carried out to determine the evolution of the magnetic field generated in the axis D of probe 20 in the presence of ferromagnetic rod 70 and in the absence of ferromagnetic rod 70. For the fifth test, ferromagnetic rod 70 is made of ferrite. The ferromagnetic rod 70 is sharpened from a rod with a diameter of 750 μm, so that at its end 54, on which the coils 52 are wound, the diameter of the ferrite support 53 is 200 μm and the diameter of the coils 52 is 250 μm, with the enameled conductive wire 50 having a diameter of 40 μm. For the fifth test, in the presence of ferromagnetic rod 70, the conductive wire 50 has two coils 52. For the fifth test, in the absence of ferromagnetic rod 70, the conductive 50 has five coils wound around support 53, which has a diameter of 250 μm.

Figure 19:
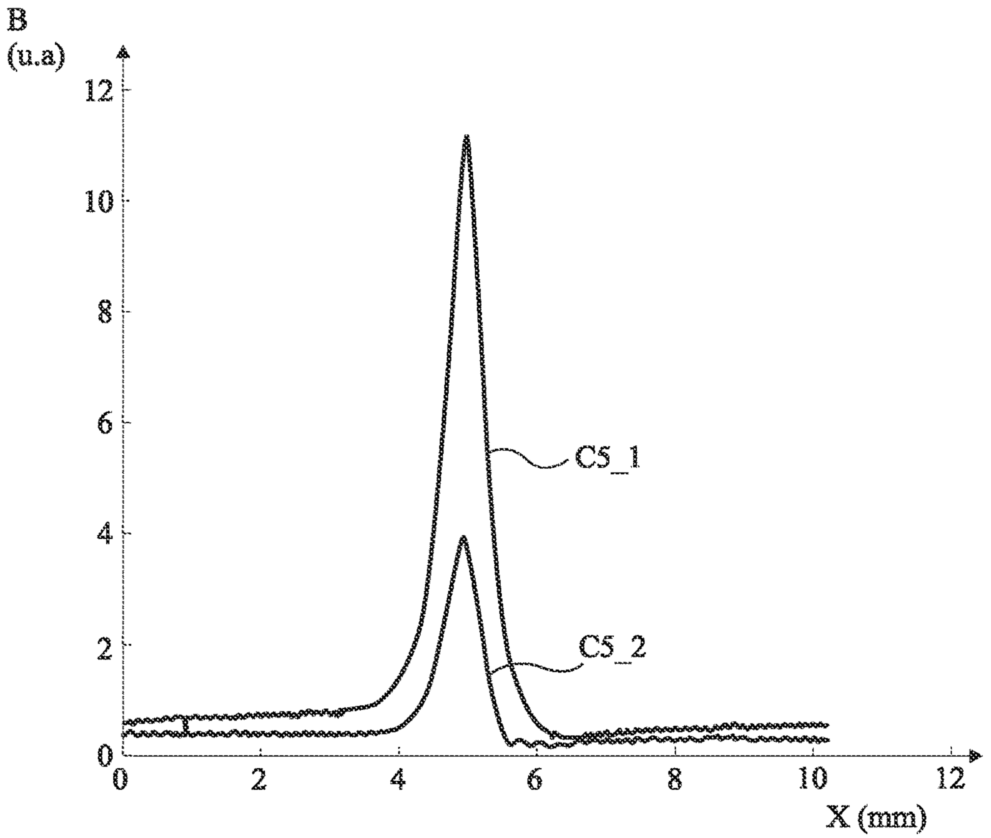

FIG. 19 illustrates curves C5-1 and C5-2 showing the evolution of the component Bz of the magnetic field along a transverse cross-section parallel to the plane of the printed circuit board, in arbitrary units, generated at a fixed distance of 20 μm from the end 54 of probe 20, when probe 20 includes ferromagnetic rod 70 (curve C5_1) and when probe 20 does not include ferromagnetic rod 70 (curve C5_2). The fifth test highlights the gain made by using the ferromagnetic rod 70 when remaining below the ferrite saturation threshold, around 300 mT, in the intensity of the magnetic field generated at a given distance from the end 54 of the probe 20, which contributes to improve the sensitivity of the probe 20 at constant current flowing through the coils 52. At constant induction, this reduces the stress imposed on the peak pulse current that must flow in the small-diameter conductor 50. It appears that the amperometric sensitivity of probe 20 is directly proportional to the relative magnetic permeability of the ferrite making up ferromagnetic rod 70. The higher the permeability, the greater the induction for a given peak pulse current. For a ferromagnetic rod 70 the rod diameter of which remains comparable to the rod length, the relative magnetic permeability multiplies the local magnetic field by about a factor of three. The relative magnetic permeability of this type of ferrite persists up to a frequency of at least 50 MHz. So it's not the ferrite's bandwidth that's the limiting factor, but its saturation and its temperature sensitivity.

A sixth test is carried out to determine the evolution of the magnetic field generated by the probe 20 in the plane of the printed circuit board 3. For the sixth test, the conductive wire 50 has two coils 52. Probe 20 comprises ferromagnetic rod 70. For the sixth test, ferromagnetic rod 70 is made of ferrite and has a diameter of 200 μm.

Figure 20:
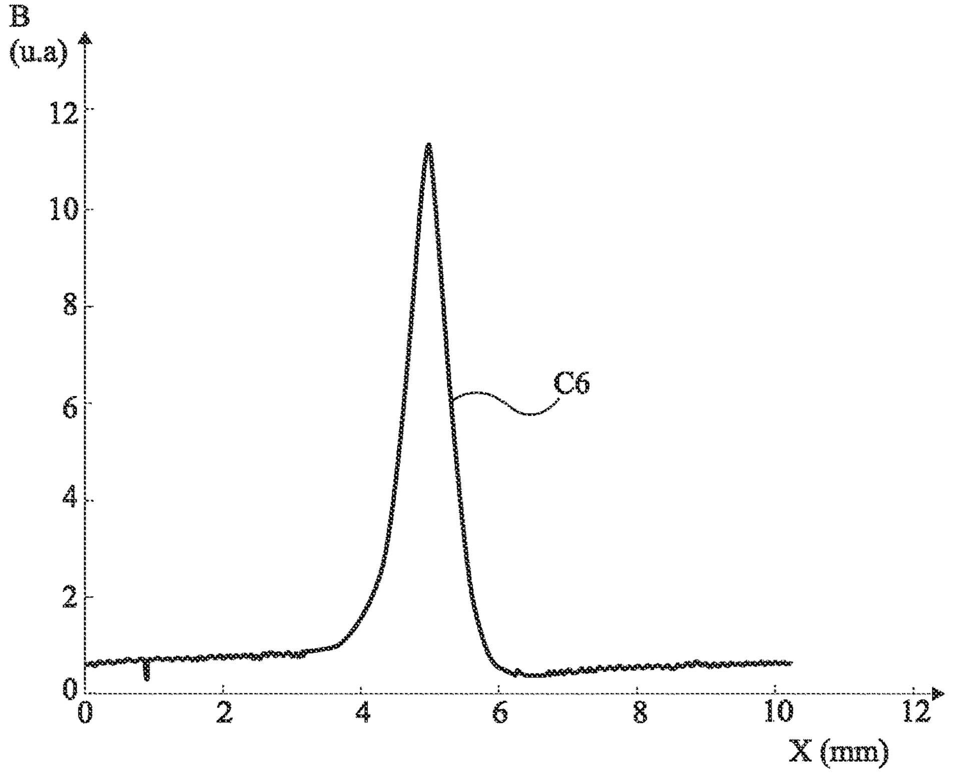

FIG. 20 illustrates a curve C6 showing the evolution of the component Bz of the magnetic field, in arbitrary units, generated by probe 20 measured on a line on the top face of the printed circuit board when the probe is almost in contact with the printed circuit board to within a few microns. The half-height width of the magnetic field is 660 μm. That is, at a distance of 330 μm from the axis D of probe 20, the magnetic field has already dropped by at least 50%. The sixth test highlights that the spatial extent of the magnetic field produced by probe 20 is reduced. Advantageously, this allows a small area to be selectively probed. In particular, for a printed circuit board 3, this prevents several adjacent tracks from simultaneously producing acoustic signals that would interfere with the measurement.

Various embodiments and variants have been described. Those skilled in the art will understand that certain features of these embodiments can be combined and other variants will readily occur to those skilled in the art. By way of example, the embodiments of the probe 20 described in relation to FIGS. 4 and 6 comprising the support 83 can be implemented with the embodiment of the guide 40 described in relation to FIGS. 7 and 8.

Finally, the practical implementation of the embodiments and variants described herein is within the capabilities of those skilled in the art based on the functional description provided hereinabove.

What is claimed is:

1. A system for measuring an electric current flowing through an electrically conductive element, the system comprising:

- a device for generating a magnetic field in the electrically conductive element, comprising a support and an electrically conductive wire rigidly coupled to the support, and comprising at least one coil wound around the support;
- a detection device for detecting acoustic waves on the surface of the electrically conductive element; and
- a control and acquisition device comprising a generator configured to provide at least one current pulse in the electrically conductive wire and an acquisition chain for detecting an electrical signal provided by the detection device so that the electric current flowing through the electrically conductive element is measured.

2. The system according to claim 1, further comprising an acoustic waveguide having a base and a tapered end attached to the support, and wherein the detection device is an electroacoustic transducer rigidly coupled to the base.

3. The system according to claim 1, wherein the detection device comprises a contactless vibration sensor.

4. The system according to claim 3, wherein the detection device comprises a laser vibrometer.

5. The system according to claim 1, wherein the support corresponds to a ferromagnetic rod, with the at least one coil wound around the ferromagnetic rod.

6. The system according to claim 1, wherein the device for generating a magnetic field comprises a permanent magnet.

7. The system according to claim 1, wherein the generator is configured to provide the current pulse in the electrically conductive wire having a duration half as short as a period corresponding to the maximum variation frequency of the electric current flowing through the electrically conductive element.

8. The system according to claim 1, wherein the control and acquisition device comprises an amplifier receiving the electrical signal, a gain of which is programmable in increasing steps, each step corresponding to a possible range of variation in a magnitude of the electric current flowing through the electrically conductive element.

9. A device for detecting an electric current flowing through an electrically conductive element comprising:

- a device for generating a magnetic field in the electrically conductive element, comprising a support and an electrically conductive wire rigidly coupled to the support and comprising at least one coil wound around the support;
- an acoustic waveguide having a base and a tapered end attached to the support; and
- an electroacoustic transducer rigidly coupled to the base so that the electric current flowing through the electrically conductive element is measured.

10. The device according to claim 9, comprising from one coil to twenty coils.

11. The device according to claim 9, wherein the support corresponds to a ferromagnetic rod, with the coils wound around the ferromagnetic rod, and wherein the ferromagnetic rod enters the acoustic waveguide through the tapered end.

12. The device according to claim 11, wherein the end of the ferromagnetic rod opposite the tapered acoustic waveguide is sharpened.

13. The device according to claim 11, comprising a permanent magnet in contact with the ferromagnetic rod housed in the acoustic waveguide.

14. The device according to claim 9, wherein the acoustic waveguide extends along an axis from the base to the tapered end, with the cross-sectional area of the acoustic waveguide decreasing from the base up to the tapered end.

15. The device according to claim 9, wherein the electroacoustic transducer is a transverse-wave electroacoustic transducer.

16. The device according to claim 9, wherein the acoustic waveguide is at least partly truncated cone shaped.

17. The device according to claim 16, wherein the acoustic waveguide has an apex angle of less than 15°.

18. The device according to claim 9, wherein the acoustic waveguide is made of a non-magnetic material.

19. The device according to claim 9, wherein the melting temperature of the acoustic waveguide and the melting temperature of the electrically conductive wire are higher than 1000° C.

20. The device according to claim 9, wherein the acoustic waveguide comprises a disk-shaped portion, having an axis, thinned at said axis, the support extending along said axis and being coupled to said portion at said axis.

21. The device according to claim 20, wherein the electroacoustic transducer comprises at least one piezoelectric half ring resonating in thickness and attached to the edge of said portion.

* * * * *